United States Patent
Andersen (10) Patent No.: US 7,315,264 B2
(45) Date of Patent: Jan. 1, 2008

(54) SYSTEMS AND METHODS FOR CONTROLLING TRANSIENT RESPONSE IN THE OUTPUT OF A NOISE SHAPER

(75) Inventor: Jack B. Andersen, Cedar Park, TX (US)

(73) Assignee: D2Audio Corporation, Austin, TX (US)

( * ) Notice: Subject to any disclaimer, the term of this patent is extended or adjusted under 35 U.S.C. 154(b) by 27 days.

(21) Appl. No.: 11/333,709

(22) Filed: Jan. 17, 2006

(65) Prior Publication Data

US 2007/0164885 A1    Jul. 19, 2007

(51) Int. Cl.
*H03M 7/30*    (2006.01)
(52) U.S. Cl. .................. 341/76; 341/155; 341/143; 375/243
(58) Field of Classification Search ............. 341/143, 341/155, 76
See application file for complete search history.

(56) References Cited

U.S. PATENT DOCUMENTS 5,649,054 A * 7/1997 Oomen et al. ............. 704/229
6,972,705 B1 * 12/2005 Fei et al. .................... 341/143
2004/0017854 A1 * 1/2004 Hansen et al. .............. 375/243

\* cited by examiner

*Primary Examiner*—Jean Bruner Jeanglaude
(74) *Attorney, Agent, or Firm*—Law Offices of Mark L. Berrier

(57) ABSTRACT

Systems and methods implemented in a multi-bit digital noise shaper for reducing or eliminating undesirable transient response when the noise shaper exits a clipping state. In one embodiment, the noise shaper includes a quantizer, a filter, and a filter control unit that detects clipping in the quantizer and dynamically adjusts the allowable range of the internal state values of the filter. In one embodiment, a clipping mechanism is provided for each state value within the filter to clip the state value if it exceeds a corresponding clipping level. The clipping level for each state value is lower when the quantizer is clipping, and higher when the quantizer is not clipping. The clipping level for each state value may be transitioned either immediately or gradually from a current level to a target level (which is lower when the quantizer is clipping, and higher when the quantizer is not clipping.)

20 Claims, 6 Drawing Sheets

SYSTEMS AND METHODS FOR CONTROLLING TRANSIENT RESPONSE IN THE OUTPUT OF A NOISE SHAPER

BACKGROUND

1. Field of the Invention

The invention relates generally to noise shapers such as those used in digital audio amplifiers and more particularly to systems and methods for controlling transient response in the output of a noise shaper when the noise shaper stops clipping an output signal.

2. Related Art

Digital amplifiers may process signals in various ways. For instance, it is common for pulse width modulated (PWM) digital amplifiers to use a noise shaper to quantize an input signal (i.e., to convert the signal from an N-bit signal to an M-bit output signal that may have a maximum amplitude.) The noise shaper also provides some feedback based on the filtered difference between the input and output signals to shape the noise spectrum of the output signal.

Figure 1:
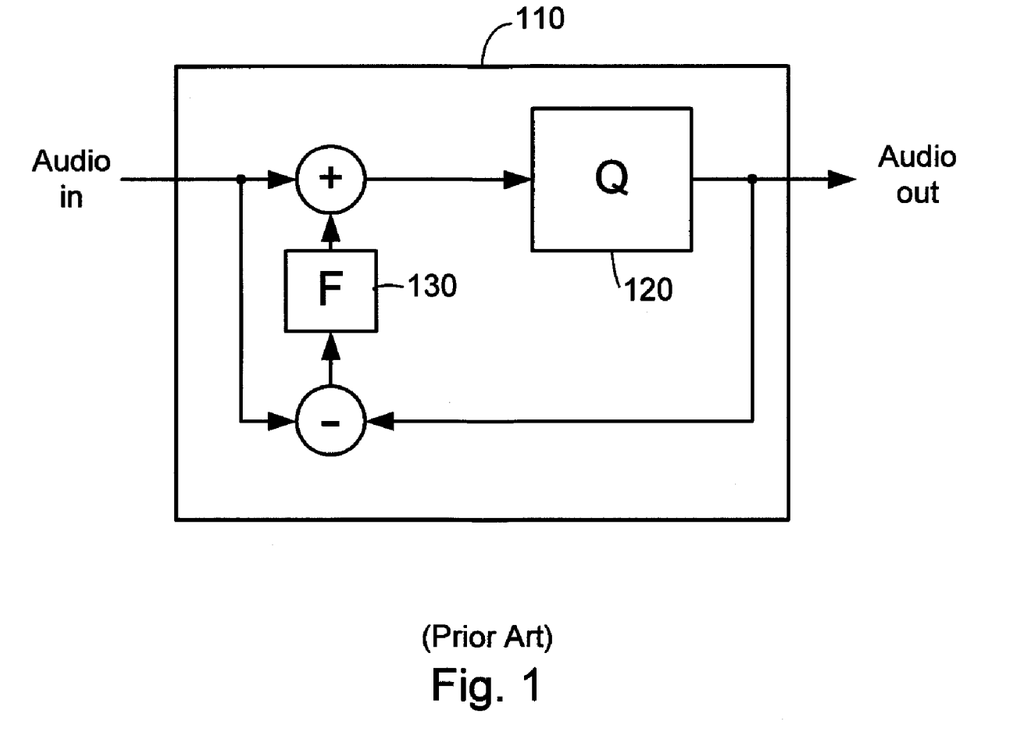
FIG. 1 is a functional block diagram illustrating a typical structure for a conventional noise shaper.

Referring to FIG. 1, a functional block diagram illustrating a typical structure for a conventional noise shaper is shown. Noise shaper 110 normally includes a quantizer 120 and a filter 130. An input digital audio (e.g., pulse code modulated, or PCM) signal is input to noise shaper 110. A feedback signal is added to the input signal before it is input to quantizer 120. Quantizer 120 generates an output digital audio signal corresponding to the input signal. The difference between the input and output signals is provided to filter 130, which processes the difference to generate the feedback signal that is added to the input signal before it is quantized.

Quantizer 120 takes the signal, which often has a high resolution (e.g., 16-24 bits) and generates an output digital audio signal that has the particular resolution required by subsequent components in the amplifier's data path (e.g., 9 bits). Quantizer 120 not only converts the input signal to the desired resolution, but may also clip the signal if it exceeds threshold values (maximum or minimum.)

Filter 130 generates a feedback signal to reshape the noise spectrum of the audio signal received by noise shaper 110 and the quantized output signal. As noted above, the output audio signal is subtracted from the input audio signal to produce a difference signal. Filter 130 receives the difference signal and filters the difference signal to produce the feedback signal. Filter 130 normally maintains internal state data, so that the filtering of the difference signal during each audio sample period is based on the difference signal values in preceding sample periods.

One of the problems that may be experienced in a noise shaper as shown in FIG. 1 relates to the quantizer clipping the output signal. When clipping of the output signal occurs, the difference between the input and output signals begins to increase. As the difference between these signals increases, the filter tries to compensate to reduce the difference. For instance, when input is high, the filter generates a higher signal to increase the quantizer output (which has been clipped) to the level of the input. Because the quantizer clips the signal at the same level, however, the increased filter signal doesn't affect the quantizer output. The filter therefore continues to increase its output to try to equalize input and output signals. If the filter uses integration, as the filter continues to try to equalize the input and output signals, the internal state of the filter "winds up." That is, the state values increase to levels that are typically much higher than their normal operating ranges.

Figure 2:
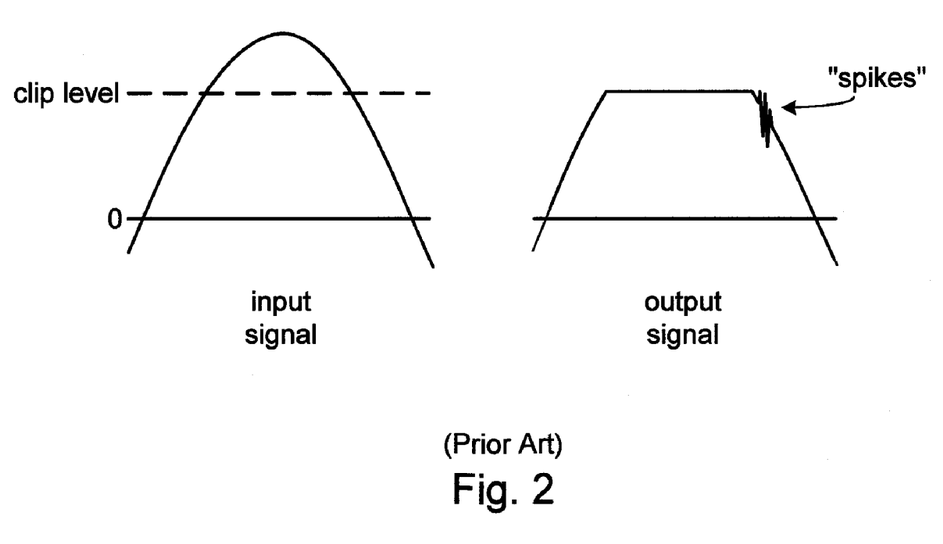
FIG. 2 is a diagram illustrating the clipping of an audio signal and the spikes that result from wind-up of internal state in some prior art noise shapers.

While the quantizer continues to clip the output signal, the wind-up of the internal state of the filter is not apparent. When the signal drops below the level at which the quantizer clips the signal, however, the filter is still trying to provide feedback based on a large difference between the input and output signals. As a result, the filter actually introduces a relatively large error. As the filter processes this error, the filter signal may oscillate between being too high and too low, causing spikes or other undesirable artifacts in the quantizer output signal. These spikes in the transient response of the signal are shown in FIG. 2. FIG. 2A illustrates an input signal and the level at which the signal will be clipped by the noise shaper. FIG. 2B illustrates the output signal produced by the noise shaper. It can be seen that the windup of the internal state of the noise shaper causes spikes in the signal when the noise shaper stops clipping the signal.

Traditionally, the solution to this problem is to limit (e.g., clip) the internal state values of the filter so that they cannot get too high, thereby limiting the spikes that are caused when the quantizer stops clipping. There is, however, a tradeoff—the more the state values are limited, the less wind-up of the internal state (and spikes or artifacts in the output) will occur, but the filter also has less freedom to compensate for the difference between the input and output signals. Also, if clipping of the internal state occurs often, this may cause noise in the output. If the state values are less restricted, the filter will be able to better compensate for the difference between the input and output signals, but the spikes or artifacts will be worse. The conventional solution is therefore to compromise between noise spectrum reshaping and the reduction of spikes or artifacts by selecting limits for state values that are low enough to somewhat restrict the spikes or artifacts, but also high enough to allow the filter to provide some feedback for reshaping the noise spectrum of the audio signal.

This conventional solution is not optimal for either the problem of spikes and artifacts, or the generation of the feedback signal. Moreover, this solution can be difficult to implement, as it is a tedious process to manually determine the levels at which each of the state values should be limited. It would therefore be desirable to provide systems and methods that reduce or eliminate spikes or artifacts in the output signal when the quantizer stops clipping, but which do not reduce the effectiveness of the filter by restricting its internal state when the quantizer is not clipping.

SUMMARY OF THE INVENTION

This disclosure is directed to systems and methods implemented in a multi-bit digital noise shaper for reducing or eliminating spikes or other undesirable transient response when the noise shaper exits a clipping state. (It should be noted that references herein to "spikes," "artifacts" or the like should be construed to include any type of undesirable transient response.) In one embodiment, the noise shaper includes a quantizer and a filter similar to conventional noise shapers, and a filter control unit that detects clipping in the quantizer and dynamically adjusts the allowable range of the internal state values of the filter. In this embodiment, a clipping mechanism is provided for each state value within the filter to clip the state value if it exceeds a corresponding clipping level. The clipping level for each state value is modifiable so that it is set to a first (e.g., lower) level when the quantizer is clipping, and a second (e.g., higher) level when the quantizer is not clipping. The clipping level for each state value may be transitioned either immediately or gradually from a current level to a target level (which is lower when the quantizer is clipping, and higher when the quantizer is not clipping.)

One embodiment comprises a method implemented in a multi-bit digital noise shaper. The method includes quantizing an input digital audio signal to produce an output digital audio signal, clipping the output digital audio signal when the input digital audio signal exceeds a threshold value, and inhibiting undesirable transient response in the output digital audio signal when the noise shaper stops clipping the output digital audio signal. In one embodiment, the undesirable transient response in the output digital audio signal is inhibited by restricting the range of internal state values of a filter in the noise shaper when the quantizer is clipping. The state values can be restricted by clipping the values at variable levels, wherein the state clipping levels are decreased when the quantizer is clipping and increased when the quantizer is not clipping. In one embodiment, the state clipping levels are reduced to 0 when the quantizer is clipping. The increase and/or decrease in the clipping levels can be immediate or gradual.

Another embodiment comprises a multi-bit digital noise shaper having a quantizer configured to clip the output digital audio signal when the input digital audio signal exceeds a threshold value and to inhibit undesirable transient response in the output digital audio signal when the quantizer stops clipping the output digital audio signal. In one embodiment, the undesirable transient response in the output digital audio signal is inhibited by restricting the range of internal state values of a filter in the noise shaper. The state values can be restricted by clipping the values at modifiable levels. These levels are decreased when the quantizer is clipping and increased when the quantizer is not clipping. For example, in one embodiment, the state clipping levels are reduced to 0 when the quantizer is clipping. The increase and/or decrease in the clipping levels can be immediate or gradual. In one embodiment, a simple clip detect signal is filtered (e.g., using a single-pole IIR low pass filter) to generate a signal that gradually transitions between a high state clipping level and a low state clipping level.

Numerous other embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for reducing or eliminating undesirable transient response in clipped audio signals in digital amplifiers.

In one embodiment, a digital pulse width modulation (PWM) amplifier includes a noise shaper that quantizes and reshapes the noise spectrum of an input audio signal to produce an output audio signal. The noise shaper includes a quantizer configured to quantize the input audio signal and clip the signal if necessary. The noise shaper also includes a filter configured to receive a difference signal (corresponding to the difference between the output audio signal and the input audio signal,) filter the difference signal and add the filtered feedback signal to the input signal before providing the input signal to the quantizer.

In order to reduce undesirable transient response in the output signal, the noise shaper includes a clip detector configured to detect clipping of the audio signal by the quantizer and to provide an indication of the clipping to the filter. When the quantizer is not clipping the audio signal, the internal state values of the filter (which is typically an integrating filter) are allowed to vary within a first range of values. When the quantizer is clipping the audio signal, the internal state values of the filter are constrained to a reduced range which is a subset of the first range. The reduced range of values for the filter's internal state do not allow the internal state to "wind up," thereby reducing undesirable transient response in the quantizer output signal when the quantizer stops clipping.

In one embodiment, the range of the state values is controlled by a set of clipping mechanisms (quantizers) within the filter. Each state value is allowed to vary freely up to a limit at which the corresponding clipping mechanism clips the value. The level at which each state value is clipped is determined by a filter control unit. This increases the clipping levels to their respective maxima when the noise shaper quantizer is not clipping, and decreases them to lower levels when the noise shaper quantizer is clipping. The clipping levels may be immediately transitioned between upper and lower levels, or they may be gradually transitioned to these levels (e.g., by low-pass filtering a clip detect signal.)

Figure 3:
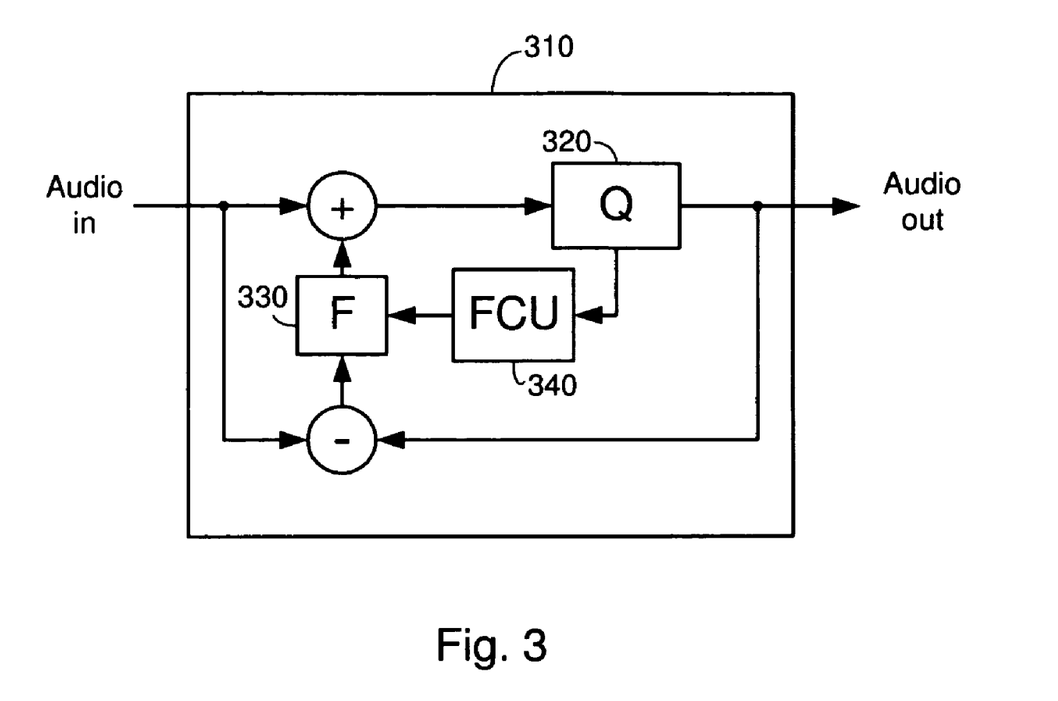
FIG. 3 is a functional block diagram illustrating the structure of a noise shaper in accordance with one embodiment.

Referring to FIG. 3, a functional block diagram illustrating the structure of a noise shaper in accordance with one embodiment of the invention is shown. In this embodiment, noise shaper 310 is implemented in a digital pulse width modulated (PWM) amplifier. Noise shaper 310 includes a quantizer 320 and a filter 330, similar to conventional noise shaper designs. Noise shaper 310, however, also includes a filter control unit 340 which is coupled between quantizer 320 and filter 330.

Filter control unit 340 is configured to monitor quantizer 320 and to determine whether or not quantizer 320 is clipping the input audio signal. Filter control unit 340 generates control information based on whether or not quantizer 320 is clipping and provides this information to filter 330. The control information is used to modify the state data within filter 330. If quantizer 320 is clipping, the state data is modified to limit the magnitude of the feedback signal that is generated by filter 330. Otherwise, the control information allows the state of filter 330 to vary normally.

Figure 4:
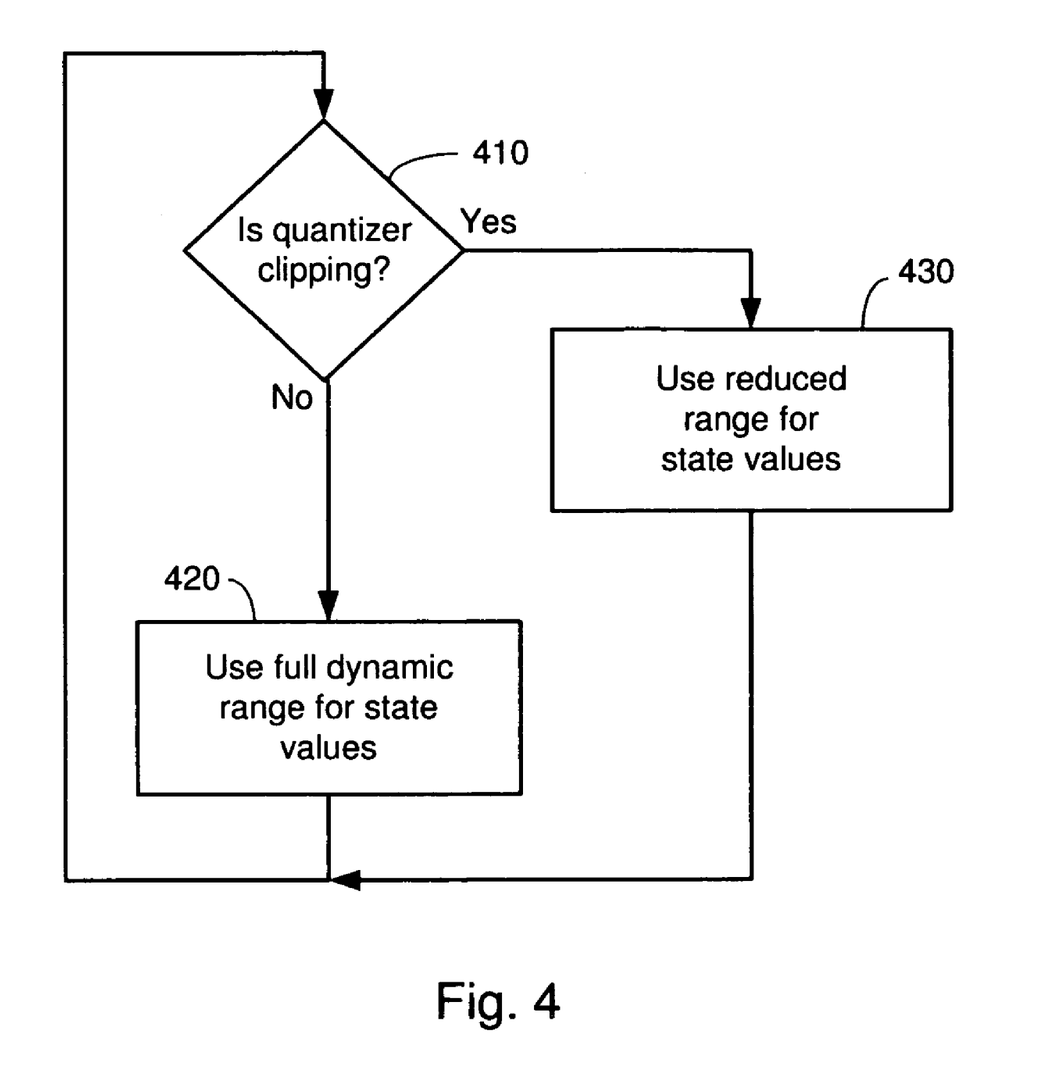
FIG. 4 is a simple flow diagram illustrating the operation of the filter control unit in the noise shaper of FIG. 3.

Referring to FIG. 4, a simple flow diagram illustrating the operation of the filter control unit in the noise shaper of FIG. 3 is shown. As depicted in this figure, filter control unit 340 continually performs a control loop in which the clipping of the noise shaper's quantizer 320 is monitored (block 410.) If the quantizer is not clipping, the state values of filter 330 are allowed to vary within their full ranges of possible values (block 420.) If, on the other hand, the quantizer is clipping, the state values of filter 330 are constrained to reduced ranges (block 430.) It should be noted that the filter control unit may be configured to transition gracefully between full and reduced ranges of allowable state values, rather than making abrupt shifts between them.

Figure 5:
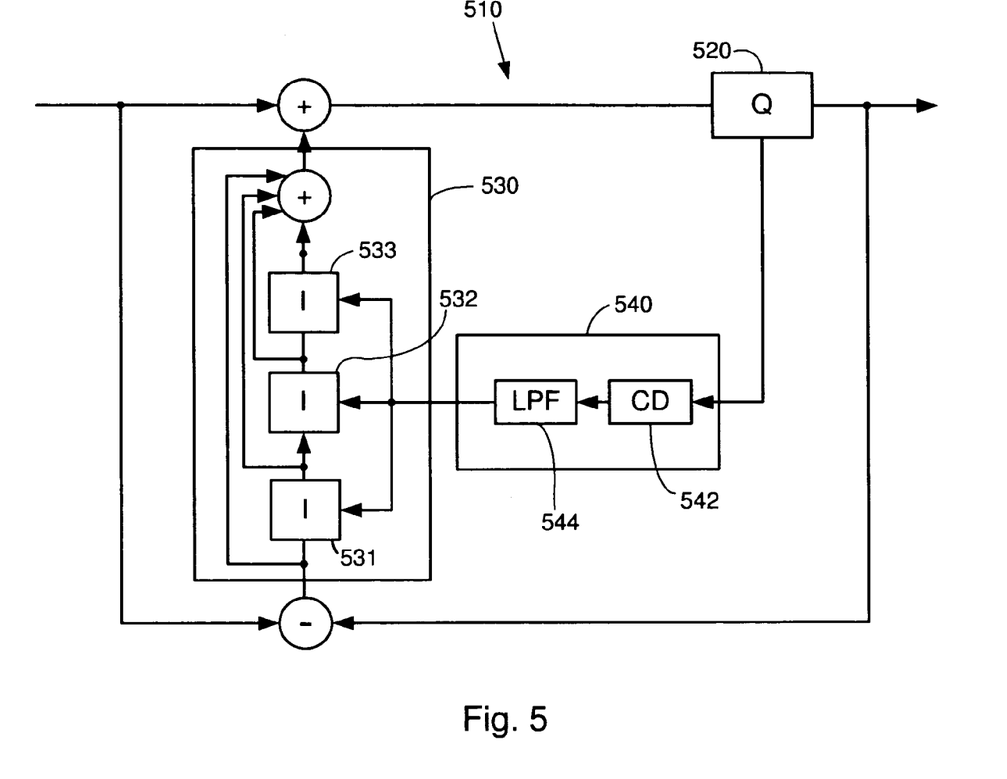
FIG. 5 is a more detailed functional block diagram illustrating the structure of a noise shaper in accordance with one embodiment.

Referring to FIG. 5, a more detailed functional block diagram illustrating the structure of a noise shaper in accordance with one embodiment is shown. In this embodiment, an input audio signal is received by noise shaper 510, and a feedback signal generated by filter 530 is added to the input signal to produce a modified input signal. The modified input signal is provided to quantizer 520, which produces an output audio signal corresponding to the input signal, where the output signal is quantized and possibly clipped. As with the embodiment of FIG. 3, filter control unit 540 detects clipping in quantizer 520 and provides corresponding control signals to filter 530. Filter 530 also receives a signal which is the difference between the input audio signal and output audio signal. Filter 530 generates the feedback signal based on this different signal and the control signals received from filter control unit 540.

Filter control unit 540 includes a clip detector 542 and a low pass filter 544. Clip detector 542 simply detects clipping in quantizer 520 and produces a binary signal indicating whether or not quantizer 520 is clipping. This signal is received and filtered by low pass filter 544. The effect of low pass filter 544 is to apply a "smoothing" function and to thereby produce a signal that does not transition sharply between high and low values, but instead moves more gradually between the high and low values. The signal produced by low pass filter 544 is output by filter control unit 540 and provided to filter 530.

It can be seen that filter 530 includes a series of integrators 531-533. The difference signal is provided to a first one of integrators (531), and the output of this integrator is provided to the next of the integrators in the series (532). The output of integrator 532 is then provided to the next integrator (533). The output of each of the integrators is then summed with the original difference signal. The result is output by filter 530 as the feedback signal, and is added to the input audio signal.

It should be noted that the structure of filter 530 as depicted in FIG. 5 is a very simplified example of the type of filter that is typically implemented in a noise shaper. These filters may have many more integrators (or resonators) than the three depicted in the figure. The filters may also have numerous other components which have been omitted from the figure for purposes of clarity. Because the additional components and their operation are well known and understood in the field of digital amplifier designed, they will not be described in detail here.

Each of integrators 531-533 within filter 530 maintains internal state data that is updated in each PWM switch period. In one embodiment, the state comprises a state value that is stored in a corresponding register. Additionally, each integrator includes a clipping mechanism configured to clip the state value for the integrator when it exceeds a corresponding maximum clip level. ("Maximum," as used here, refers to the magnitude of the clip levels—signals may therefore range between the positive and negative of the maximum, or from +maximum to −maximum.)

The state value for each integrator normally remains well below the maximum level when the quantizer is not clipping. In this situation, the difference between the output and input audio signals typically ranges from minus one-half of the step size to plus one-half of the step size of quantization levels in the output audio signal. The feedback signal therefore only needs to process this relatively small difference. When the quantizer clips, however, the difference between the output and input audio signals increases, and the state values of the integrators increase as the filter tries to compensate for the increasing difference between the output and input audio signals. Because the clipping of the quantizer maintains a (sometimes substantial) difference between the output and input signals, the state values continue to increase, often until they reach their maximum values (the values at which they are clipped.)

As indicated above, conventional noise shapers set the level at which the state value is clipped to a compromise value. That is, the clip level is lower than desirable for operation when the quantizer is not clipping, but higher than desirable for limiting the wind-up of the state value when the quantizer is clipping. In the present systems and methods, however, the clip level for each integrator is variable. The clip level is set to a higher value when the quantizer is not clipping, and to a lower value when the quantizer is clipping. The state values can therefore have a wider range of values if necessary to perform noise shaping on a non-clipped signal, but are limited to a more narrow range of values when trying to perform noise shaping on a clipped signal. By restricting the range of state values, the system prevents the wind-up of the internal state of the filter and the resulting undesirable transient response when the quantizer stops clipping the signal.

Referring again to FIG. 5, each of integrators 531-533 has an associated internal state S1-S3, respectively. The data path of filter 530 updates internal states S1-S3. Conventionally, the internal state of each integrator is clipped at a set level QNSLEV, according to the state clipping function QNS():

if (x>QNSLEV)

y=QNSLEV;

else if (x<−QNSLEV)

y=−QNSLEV;

else y=x;

where x is the state before being clipped, and y is the state after being clipped. As noted above, the state clipping level QNSLEV is conventionally set to a compromise value which does not change. The clipping level is typically set to a value at which wind up of the internal state of the filter is somewhat limited, but can still vary enough to perform reasonable noise reshaping of the input audio signal.

In the present systems and methods, rather than using a set value for the clipping level, the clipping level is dynamically adjusted, depending upon whether or not the quantizer is clipping. In this case, the state clipping function QNS() can still be used, but clipping level QNSLEV is variable.

In one simple implementation, the clipping level is set to a lower value when the quantizer is clipping, and to a higher value when the quantizer is not clipping. This can be expressed as:

if (CLIP)

QNSLEV=LEVLO;

else

QNSLEV=LEVHI;

where CLIP is a binary signal that is true when the quantizer is clipping, and false when the quantizer is not clipping. LEVLO is the lower clipping level value and LEVHI is the higher clipping level value. While LEVLO and LEVHI can be set to any values that are possible for QNSLEV, they are preferably selected so that LEVHI is greater than the conventionally chosen value for QNSLEV (e.g., 1,) and LEVLO is lower than the conventionally chosen value for QNSLEV (e.g., $\frac{1}{128}$.)

it should be noted that it is possible for the quantizer to clip for a single sample, or even a few samples, without causing the internal state to wind up. In this case, it may be advantageous not to restrict the internal state of the noise shaper too much by reducing the clip level QNSLEV too quickly (e.g., by switching QNSLEV immediately between the high and low clipping levels.) The rate at which QNSLEV is switched between the high and low levels can be controlled by, for example, filtering the target clip level (which is either high or low) through a single-pole IIR (infinite impulse response) low-pass filter (e.g., 544.) After the target clipping level transitions, the output of the filter gradually approaches the target level, rather than immediately switching between the high and low levels. The speed with which the filter output approaches the target clipping level is determined by a time constant which can be set to an appropriate value.

Referring again to FIG. 5, clip detector 542 generates a target clip level signal, TC, and low pass filter 544 filters the target clip level signal to produce an actual clip level signal, AC. The actual clip level signal is then provided to each of integrators 531-533 in filter 530, where it is used as a dynamic clipping level, QNSLEV.

TC can be expressed by the function:

if (CLIP)

TC=LEVLO;

else

TC=LEVHI.

For implementation in digital logic, AC can then be conveniently and sufficiently expressed by the first order IIR filter function:

$$AC(n)=AC(n-1)+(TC(n)-AC(n-1))*1/(2^{QEPS}),$$

where n is the number of the sample of the input audio signal being processed, and QEPS is a value that that sets a "time constant" (epsilon=$\frac{1}{2}^{QEPS}$) for the low pass filter.

Figure 6:
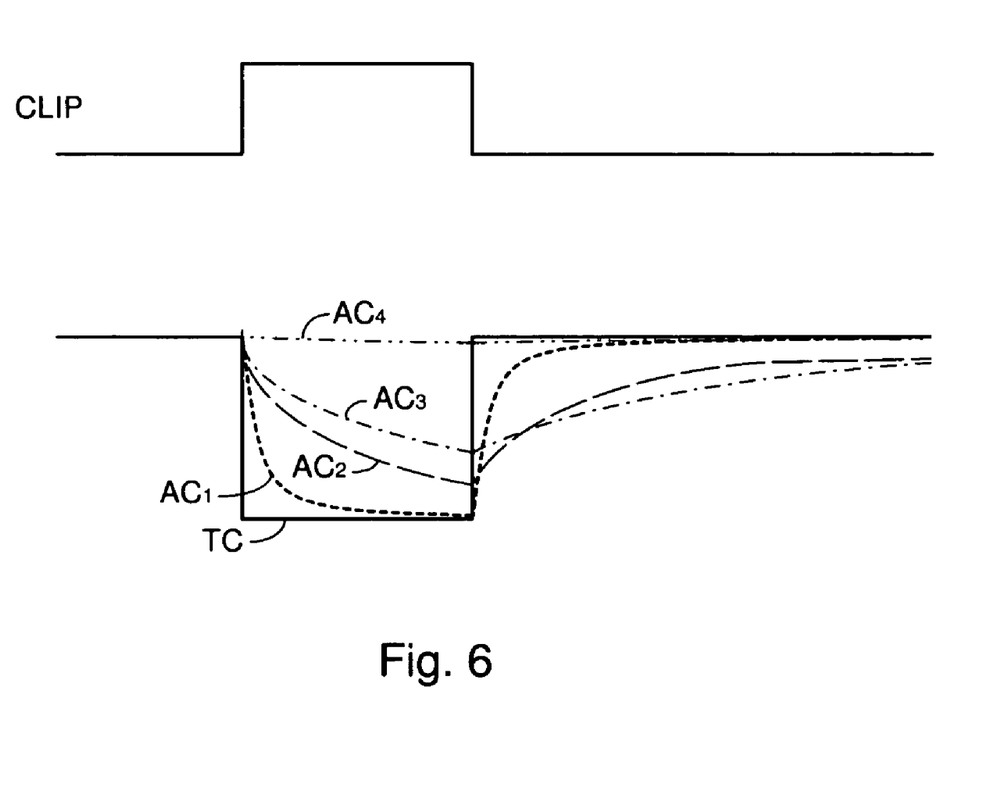
FIG. 6 is a diagram illustrating the relationship of various signals within the noise shaper of FIG. 5.

Referring to FIG. 6, a diagram illustrating the relationship of various signals within the noise shaper of FIG. 5 is shown. FIG. 6 includes the signals CLIP, TC and AC. CLIP is a binary signal which indicates whether or not quantizer 520 is clipping the input audio signal. CLIP is high when the quantizer is clipping, and low when the quantizer is not clipping. Signal TC, which corresponds to the target clipping level, alternates between two clipping levels, LEVHI or LEVLO. TC switches immediately from one of these values to the other. Signal AC, which is the actual clipping level provided to filter 530, is not binary, but instead asymptotically approaches the value of TC.

Several versions of AC are illustrated in FIG. 6. Each of the illustrated versions corresponds to a different value of QEPS which, as pointed out above, controls the rate at which AC approaches the value of TC. Large values of QEPS will cause the clipping level to change very slowly, resulting in an essentially fixed clipping level (see $AC_4$.) Small values of QEPS will cause the clipping level to change very quickly. For instance, a value of 0 will cause the clipping level to follow the target level exactly, switching immediately between the levels LEVHI and LEVLO (see TC.) Intermediate values of QEPS will result in the clipping levels gradually approaching the target level (see $AC_1$, $AC_2$, $AC_3$.)

In one embodiment that provides an efficient solution in digital logic with sufficient range of levels and time constant, QNSLEV is controlled by a value (QLEV) stored in a 3-bit field of a control register. In this embodiment, QNSLEV $=1/(2^{QLEV})$. Since QLEV may range from 0-7, QNSLEV can range from 1 to $\frac{1}{128}$ (approximately 0.0078.) QEPS is likewise stored in a 3-bit field of the control register. If QEPS is set to 7, this will select a high (effectively infinite) time constant, epsilon, so that QNSLEV is essentially fixed at $\frac{1}{2}^{QLEV}$. If QEPS is set to 0, epsilon is 1, which will cause the filter to transition immediately between high and low state clipping levels. For example, QNSLEV may drop immediately to 0 when clipping occurs in the noise shaper quantizer, so all the state values will be effectively cleared. Setting QEPS to 1 through 6 will select gradually 'slower' time constants for lowering QNSLEV towards 0 while the main noise shaper clips. QLEV and QEPS can be selected to ensure graceful recovery of the noise shaper after clipping.

It should be noted that the embodiments described above are intended to be illustrative. Alternative embodiments may implement one or more of the features described above using mechanisms or algorithms other than those described above. For example, while some embodiments may restrict the filter's internal state values based on simple detection of clipping in the quantizer, others may restrict the state values based on more complex clipping conditions (e.g., when clipping persists for several sample intervals.) In another example, one embodiment may use a single-pole IIR filter function to transition the clp levels, other embodiments may use other types of functions for this purpose. In yet another example, while some embodiments may control the filter's signal output by restricting the filter's internal state, other embodiments may achieve a similar result by adjustably clipping the difference signal input to the filter or even the output of the filter.

Those of skill in the art will understand that information and signals may be represented using any of a variety of different technologies and techniques. For example, data, information, signals, bits, and the like that may be referenced throughout the above description may be represented by voltages, currents, electromagnetic waves, or the like, including combinations thereof. The information and signals may be communicated between components of the disclosed systems using any suitable transport media, including wires, metallic traces, and so on.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A multi-bit digital noise shaper comprising:
   a noise shaper quantizer configured to
      quantize an input digital audio signal and to produce an output digital audio signal, and
      clip the output digital audio signal when the input digital audio signal exceeds a threshold value; and
   a filter coupled to the noise shaper quantizer and configured to filter a difference between the input digital audio signal and the output digital audio signal and to add the filtered difference to the input digital audio signal,
   wherein the noise shaper is configured to inhibit undesirable transient response in the output digital audio signal when the noise shaper quantizer stops clipping the output digital audio signal by enabling an internal state of the noise shaper to vary within a first range of values when the noise shaper quantizer is not clipping an input signal, and enabling the internal state of the noise shaper to vary within a second range of values when the noise shaper quantizer is clipping the input signal.

2. The noise shaper of claim 1, wherein the second range of values is less than the first range of values.

3. The noise shaper of claim 2, wherein the internal state of the noise shaper comprises a set of state values stored within the filter.

4. The noise shaper of claim 3, wherein the filter comprises one or more internal quantizers configured to clip the set of state values at corresponding clipping levels.

5. The noise shaper of claim 4, further comprising a filter control unit coupled to the filter and configured to set the clipping levels for the filter's internal quantizers.

6. The noise shaper of claim 5, wherein the filter control unit is configured to set the clipping levels for the filter's internal quantizers at a first predetermined set of clipping levels when the noise shaper quantizer is not clipping and to set the clipping levels for the filter's internal quantizers at a second predetermined set of clipping levels when the noise shaper quantizer is clipping, wherein the first predetermined set of clipping levels is higher than the second predetermined set of clipping levels.

7. The noise shaper of claim 6, wherein the second predetermined set of clipping levels comprise 0's.

8. The noise shaper of claim 5, wherein the clipping levels for the filter's internal quantizers are variable, and wherein the filter control unit is configured to transition the clipping levels for the filter's internal quantizers to a target set of clipping levels, wherein the target set of clipping levels comprise a first predetermined set of clipping levels when the noise shaper quantizer is not clipping and a second predetermined set of clipping levels when the noise shaper quantizer is clipping, wherein the first predetermined set of clipping levels is higher than the second predetermined set of clipping levels.

9. The noise shaper of claim 8, wherein the filter control unit is configured to transition the clipping levels for the filter's internal quantizers immediately between the first and second predetermined set of clipping levels.

10. The noise shaper of claim 8, wherein the filter control unit is configured to transition the clipping levels for the filter's internal quantizers gradually between the first and second predetermined set of clipping levels.

11. The noise shaper of claim 10, wherein the filter control unit is configured to transition the clipping levels for the filter's internal quantizers according to a smoothing function.

12. The noise shaper of claim 10, wherein the filter control unit comprises a single pole IIR filter configured to filter a clip detect signal indicative of whether the noise shaper quantizer is clipping, and is configured to transition the clipping levels for the filter's internal quantizers according to the filtered clip detect signal.

13. A method implemented in a multi-bit digital noise shaper comprising:
   quantizing an input digital audio signal to produce an output digital audio signal;
   clipping the output digital audio signal when the input digital audio signal exceeds a threshold value; and
   inhibiting undesirable transient response in the output digital audio signal when the noise shaper stops clipping the output digital audio signal, wherein inhibiting undesirable transient response in the output digital audio signal includes enabling an internal state of the noise shaper to vary within a first range of values when the quantizer is not clipping an input signal; and enabling the internal state of the noise shaper to vary within a second range of values when the quantizer is clipping the input signal.

14. The method of claim 13, wherein the second range of values is less than the first range of values.

15. The method of claim 14, wherein the internal state of the noise shaper comprises a set of state values stored within a filter of the noise shaper.

16. The method of claim 15, wherein enabling the internal state of the noise shaper to vary within the first range of values comprises clipping the set of internal state values at a first set of state clipping levels and wherein enabling the internal state of the noise shaper to vary within the second range of values comprises clipping the set of internal state values at a second set of state clipping levels.

17. The method of claim 16, wherein the first set of state clipping levels comprise a predetermined high state clipping level and the second set of state clipping levels comprise a predetermined low state clipping level.

18. The method of claim 17, wherein the predetermined low state clipping level is 0.

19. The method of claim 16, wherein the second set of state clipping levels is variable and wherein the second set of state clipping levels between an upper limit and a lower limit according to a low-pass smoothing function.

20. The method of claim 19, wherein the second set of state clipping levels is determined by filtering a set of target clipping levels through a single-pole IIR filter.

* * * * *